United States Patent
Honeycutt et al.

[11] Patent Number: 6,093,968
[45] Date of Patent: Jul. 25, 2000

[54] GERMANIUM ALLOY CONTACT TO A SILICON SUBSTRATE

[75] Inventors: Jeffrey Honeycutt; Sujit Sharan, both of Boise, Id.

[73] Assignee: Micron Technology, Inc., Boise, Id.

[21] Appl. No.: 09/045,210

[22] Filed: Mar. 20, 1998

Related U.S. Application Data

[62] Division of application No. 08/673,623, Jun. 26, 1996.

[51] Int. Cl.⁷ .................................................. H01L 23/48
[52] U.S. Cl. ........................... 257/765; 257/751; 257/771
[58] Field of Search .................................... 257/771, 765, 257/751, 740

[56] References Cited

U.S. PATENT DOCUMENTS

| | | |
|---|---|---|
| 4,994,892 | 2/1991 | Zuleeg et al. . |
| 5,089,872 | 2/1992 | Ozturk et al. ........................... 357/23.9 |
| 5,281,552 | 1/1994 | King et al. . |
| 5,283,206 | 2/1994 | Sugano . |
| 5,358,616 | 10/1994 | Ward . |
| 5,401,674 | 3/1995 | Anjum ..................... 437/190 |
| 5,534,463 | 7/1996 | Lee et al. . |
| 5,589,713 | 12/1996 | Lee et al. . |
| 5,644,166 | 7/1997 | Honeycutt et al. . |
| 5,691,571 | 11/1997 | Hirose et al. . |
| 5,789,317 | 8/1998 | Batra et al. .............................. 438/642 |

FOREIGN PATENT DOCUMENTS

| | | | |
|---|---|---|---|
| 61-256732 | 11/1986 | Japan ...................................... 21/302 |
| 3-161926 | 7/1991 | Japan ........................................ 21/28 |
| 4-192562 | 7/1992 | Japan . |
| 5-6995 | 1/1993 | Japan ..................................... 257/770 |

*Primary Examiner*—Sheila V. Clark
*Attorney, Agent, or Firm*—Workman, Nydegger & Seeley

[57] ABSTRACT

A method is disclosed for forming a high aspect ratio submicron VLSI interconnect structure. The method makes use of the high diffusivity of aluminum alloyed with germanium and the low eutectic temperature of the alloy for more uniform filling of interconnect structure openings having high aspect ratios. The method comprises preparing a semiconductor device or portion of a semiconductor device that is to receive electrical contact, covering the semiconductor device with an insulating layer, forming an interconnect structure opening through the insulating layer, depositing a layer of germanium in the interconnect structure opening, and reflow sputtering aluminum or aluminum alloy into the interconnect structure opening. Alternatively, the aluminum or aluminum alloy can be cold sputtered into the interconnect structure opening, followed by a low temperature reflow. The aluminum will readily diffuse to the bottom of the interconnect structure opening, assisted by its high diffusivity with the germanium. An interconnect structure is formed thereby with desirable electrical conductivity characteristics even at high aspect ratios. The germanium will also rid the interconnect structure opening of native oxide layers. When forming a contact, a standard diffusion barrier may be deposited before forming the germanium layer.

27 Claims, 3 Drawing Sheets

GERMANIUM ALLOY CONTACT TO A SILICON SUBSTRATE

This is a divisional patent application to U.S. patent application Ser. No. 08/673,623 filed on Jun. 26, 1996 which is incorporated herein by reference.

BACKGROUND OF THE INVENTION

1. The Field of the Invention

The present invention relates to processes for forming high aspect ratio submicron VLSI contacts, trenches, and via connections situated on a semiconductor wafer. More specifically, the present invention is a process to provide a high aspect ratio contact, trench, or via with desirable electrical characteristics by depositing a germanium underlayer in a contact, trench, or via opening situated on a semiconductor wafer and followed by an aluminum alloy sputter deposition at low temperature.

2. The Relevant Technology

Recent advances in computer technology and in electronics in general have been brought about at least in part as a result of the progress that has been achieved by the integrated circuit industry in electronic circuit densification and miniaturization. This progress has resulted in increasingly compact and efficient semiconductor devices, attended by an increase in the complexity and number of semiconductor devices aggregated on a single integrated circuit wafer. The smaller and more complex semiconductor devices, including resistors, capacitors, diodes, and transistors, have been achieved, in part, by reducing semiconductor device sizes and spacing and by reducing the junction depth of active regions formed on a silicon substrate of an integrated circuit wafer. The smaller and more complex semiconductor devices have also been achieved by stacking the semiconductor devices at various levels on the wafer.

Among the semiconductor device features which are being reduced in size are the electrical communication interconnect structures through which electrical contact is made between discrete semiconductor devices, or portions of such devices, located on nonadjacent levels of the wafer. These electrical communication interconnect structures include contacts, vias, plugs, trenches, and other structures through which electrical connection is made to discrete semiconductor devices or components of semiconductor devices, located at the varying levels of integrated circuit wafers. These and other such interconnect structures will hereafter be collectively referred to as "interconnect structures." Interconnect structure openings are defined herein as etched conduits between layers which, when filled with conductive material, form the interconnect structure. By way of example, a contact opening is an interconnect structure opening that is filled with a conductive material to form an interconnect structure called a contact. In order to continue in the process of reducing integrated circuit size, new interconnect structure formation methods which overcome certain problems existing in the art are required.

Many of the problems currently encountered when forming interconnect structures arise from the fact that the interconnect structure openings are becoming increasingly smaller. Interconnect structure openings are currently designed with diameters within the half micron range. Also, the aspect ratio of the interconnect structure openings, the ratio of the height of the openings in which interconnect structures are formed to the width of these openings, is becoming very high. Aspect ratios for interconnect structure openings are currently greater than about 3. It is difficult to deposit with good step coverage the necessary conducting filler material in these tiny, narrow, high sided interconnect structure openings. These factors make it difficult to form increasingly miniaturized interconnect structures which retain a high conductivity.

Currently, interconnect structure openings are filled with conducting filler material using one of two processes, chemical vapor deposition (CVD) and physical vapor deposition (PVD), the latter of which is also known as sputtering. Each of these processes has limitations and associated problems. For instance, limitations of the materials that can be deposited with CVD make it impractical for many applications. A shortcoming of existing PVD processes involves the phenomena of cusping, which occurs as a result of nonuniform step coverage, when high aspect ratio interconnect structure openings are being filled.

Cusping occurs during sputtering or reflowing aluminum into interconnect structure openings. Cusping occurs as aluminum aggregates at the top of the interconnect structure opening and overhangs into the center of the interconnect structure opening. Cusping is undesirable, as it blocks the interconnect structure opening before a proper thickness of aluminum can be formed at the bottom of the interconnect structure opening. This results in a partially filled interconnect structure opening with poor electrical connection characteristics and can cause total interconnect structure failure.

Other problems also arise when forming high aspect ratio submicron VLSI interconnect structures. For instance, aluminum is highly desirable as a metallization material because of its conductivity and ease of deposition, but pure aluminum is subject to electromigration failures. Electromigration failures occur when the flow of electrons through the metallization material dislodges aluminum atoms and causes an open circuit condition. This also results in poor electrical conduction or total failure.

As another example of the problems encountered, aluminum must be separated from underlying active regions in order to prevent junction spiking. Junction spiking results in the dissolution of silicon into the aluminum metallization and aluminum into the silicon. Alloy spikes are formed that can extend into the interior of the substrate from the boundary between the electrode and the substrate to cause unwanted short circuit conduction at the junction of the semiconductor in the substrate.

A further problem encountered in forming interconnect structures is the elimination of native silicon dioxide layers that grow in the bottom of the interconnect structure openings. Native silicon dioxide layers are highly insulative and can cause a high contact resistance that can also result in failure of the interconnect structures. Typically, a diffusion barrier of a material such as titanium nitride is used to overcome the problems of spiking and to remove the native silicon dioxide layers. Therefore, methods used for metallizing interconnect structures must be compatible with the currently known methods for depositing diffusion barriers.

One effort to utilize the favorable properties of aluminum germanium alloys to overcome the above and other such problems found in the art is Kikuta K., Kikkawa T., and Aoki M., *Al—Ge Reflow Sputtering for Submicron-Contact Hole Filling,* IEEE VMIC Conference, Jun. 11, 1991. In the Kikuta paper, an alloy of germanium and aluminum was sputtered from a target into a contact opening having a silicon underlayer. The Kikuta paper recognized that germanium and aluminum have a low eutectic alloying temperature of around 424° C. that allows germanium to readily diff-use into aluminum. Consequently, the Kikuta paper found it desirable to sputter germanium-aluminum alloy as a metallization material, and noted that the alloy flowed more readily into a contact opening and at a lower temperature than does pure aluminum.

In practice, the alloy sputtering method of the Kikuta paper has proven to have certain drawbacks. One problem with sputtering germanium-aluminum alloy into an interconnect structure opening as described in the Kikuta paper is that germanium-aluminum targets are expensive. Also, in order to vary the concentrations of the alloy, a different target is required for each desired concentration. The electromigration resistance of the aluminum and 5% germanium alloy described in the Kikuta paper is no better than that of pure aluminum. Thus, sputtering a germanium-aluminum alloy does not significantly improve electromigration effects, and other materials must also be added to the alloy. This makes the targets even more expensive and makes the process even more inflexible, as a new target is needed for every change in alloy material or concentration.

From the above discussion, it is apparent that a need exists in the art for a method of metallizing an interconnect structure opening having a high aspect ratio that results in high electrical conductivity. The method should utilize the beneficial qualities of germanium-aluminum alloying, such as a low eutectic point and high diffusivity, without the high cost of sputtering a germanium-aluminum alloy and should be capable of use with an additional alloy such as copper that alleviates high electromigration resistance. Such a method would also be highly useful if it could help remove native silicon dioxide from the interconnect structure opening and if it were compatible with diffusion layer processes for overcoming spiking problems.

SUMMARY AND OBJECTS OF THE INVENTION

The present invention seeks to resolve the above and other problems which have been experienced in the art. More particularly, the present invention constitutes an advancement in the art by providing a high aspect ratio submicron VLSI interconnect structure and a method of making the interconnect structure which achieves each of the objects listed below.

It is an object of the present invention to provide a method of forming high aspect ratio submicron VLSI interconnect structures having high electrical conductivity.

It is also an object of the present invention to provide such a method which rids the interconnect structure opening of native silicon dioxide without the need for specialized cleaning processes.

It is another object of the present invention to provide such a method that is capable of filling high aspect ratio interconnect structure openings more readily and more uniformly than conventional methods.

It is a further object of the present invention to provide such a method that forms a germanium-aluminum alloy in the interconnect structure opening without the use of expensive sputtering targets.

It is likewise an object of the present invention to provide such a method that is more flexible in creating varying concentrations of a germanium-aluminum alloy than known sputtering techniques.

It is yet another object of the present invention to provide such a method that also allows the use of lower temperatures in the metallization of an interconnect structure to thereby facilitate reduced aluminum film surface roughness.

It is still further an object of the present invention to provide such a method that is capable of using standard VLSI aluminum alloys such as aluminum-copper and aluminum-copper-silicon in order to prevent high electromigration resistance.

These and other objects and features of the present invention will become more fully apparent from the following description and appended claims, or may be learned by the practice of the invention as set forth hereinafter.

To achieve the foregoing objects, and in accordance with the invention as embodied and described herein, the present invention comprises a method of VLSI interconnect structure formation using a low temperature aluminum metallization over a germanium underlayer. The method takes advantage of the high diffusivity of germanium in aluminum as well as the low eutectic temperature of germanium and aluminum to provide a process for filling interconnect structure openings that results in uniform filling of the interconnect structure openings despite the use of high aspect ratios in forming the interconnect structure openings.

The process comprises first forming a portion of a semiconductor device that is to be provided with electrical contact to other semiconductor devices or portions of devices through an electrical interconnect structure. After formation of the portion of the semiconductor device, an insulating layer is formed over the portion of the semiconductor device, and an interconnect structure opening is etched through the insulating layer to create an access to the portion of the semiconductor device.

When the interconnect structure being formed comprises a contact, a diffusion barrier is formed at the bottom of the interconnect structure opening, preferably using titanium or titanium nitride. The diffusion barrier serves to remedy spiking problems, and is not necessary in basic via or trench formation, as vias and trenches are used to connect to a metallized portion of a semiconductor device that will not incur such spiking problems.

In the next step, a layer of germanium is deposited in the interconnect structure opening. The germanium deposition is preferably conducted using a low pressure chemical vapor deposition (LPCVD) process with a source gas of germane ($GeH_4$). The germanium layer is preferably deposited with a uniform thickness of about 50–200 angstroms, though the thickness of the germanium layer will vary with the required concentration of the germanium-aluminum alloy. Where a deposition barrier has not been previously formed, the germanium layer will remove existing native oxide layers.

After the deposition of the germanium layer, a metallization material of aluminum or an aluminum alloy is then deposited into the interconnect structure opening. The preferred metallization material is an aluminum-copper alloy, due to the high electromigration resistance provided by the aluminum-copper alloy. The metallization material can be deposited in one of two embodiments. In the first embodiment, the metallization material is deposited with PVD, and is preferably sputtered into the interconnect structure opening at a temperature of about 250 to 350° C. and at a pressure of about $\times 10^{-7}$ to $1 \times 10^{-2}$ torr. This will cause the aluminum to begin to alloy with the germanium and the resulting solid phase diffusion of germanium into aluminum will cause the aluminum metallization material to migrate to the bottom of the interconnect structure opening.

The second embodiment comprises cold sputtering the metallization material into the interconnect structure opening at a temperature of about 200° C. and at a pressure of about $1 \times 10^{-7}$ to $1 \times 10^{-2}$ torr. A further step is to then reflow the metallization material at a temperature of about 300° C. to 400° C. and about 1×10⁻⁷ to 1×10⁻² torr. The reflow step at higher temperatures causes the metallization material to alloy with the germanium, and as a result of the diffusion thereof, to migrate to the bottom of the interconnect structure opening. In either embodiment, the aluminum of the metallization will flow into material at the bottom of the interconnect structure opening more readily as a result of solid phase interdiffusion with the germanium than if the germanium was not present in the reflow step. As a result of the better flow of the metallization material, the contact will be more uniformly filled, will have a higher conductivity, and will have a reduced tendency to cause chip failures. Thus, the method of the present invention provides for the formation of a submicron VLSI interconnect structure opening utilizing the favorable qualities of a germanium-aluminum alloy in order to form a high aspect ratio interconnect structure having desirable electrical characteristics.

BRIEF DESCRIPTION OF THE DRAWINGS

In order that the manner in which the above-recited and other advantages and objects of the invention are obtained, a more particular description of the invention briefly described above will be rendered by reference to specific embodiments thereof which is illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention comprises a method for forming a high aspect ratio submicron VLSI electrical interconnect structure. The present invention utilizes a germanium layer at the bottom of the interconnect structure which, at low temperatures, diffuses with and assists a layer of aluminum or aluminum alloy metallization material to the bottom of the interconnect structure opening to thereby uniformly fill the interconnect structure opening. The method of the present invention is highly beneficial for providing electrical contact to diodes, resistors, capacitors, transistors, and other such semiconductor devices formed in high density on integrated circuit semiconductor substrates.

The process of the present invention comprises, in an initial step, the formation on a semiconductor substrate of a semiconductor device or portion of a semiconductor device that is to be provided electrical connection with other semiconductor devices or portions of semiconductor devices by the interconnect structure. In the case where the interconnect structure is to be formed comprises a contact, a portion of the semiconductor substrate is doped to form an active region. When the interconnect structure to be formed comprises a via, a semiconductor device such as a resistor, transistor, or capacitor is formed and other structures and semiconductor devices are then formed over the semiconductor device. A via is formed over a metallized portion of the semiconductor device to connect the semiconductor device in electrical communication with other semiconductor devices located at other levels on the integrated circuit wafer.

FIGS. 1 through 4 illustrate the method of the present invention in an embodiment wherein a contact is being formed over an active region 14 on a semiconductor substrate 12. From the description of contact formation provided herein, it will be apparent to one skilled in the art how to use the method of the present invention to form other interconnect structures such as trenches, plugs, and vias. Thus, in the depicted embodiment, the semiconductor device which is to be provided with electrical communication comprises active region 14.

Figure 1:
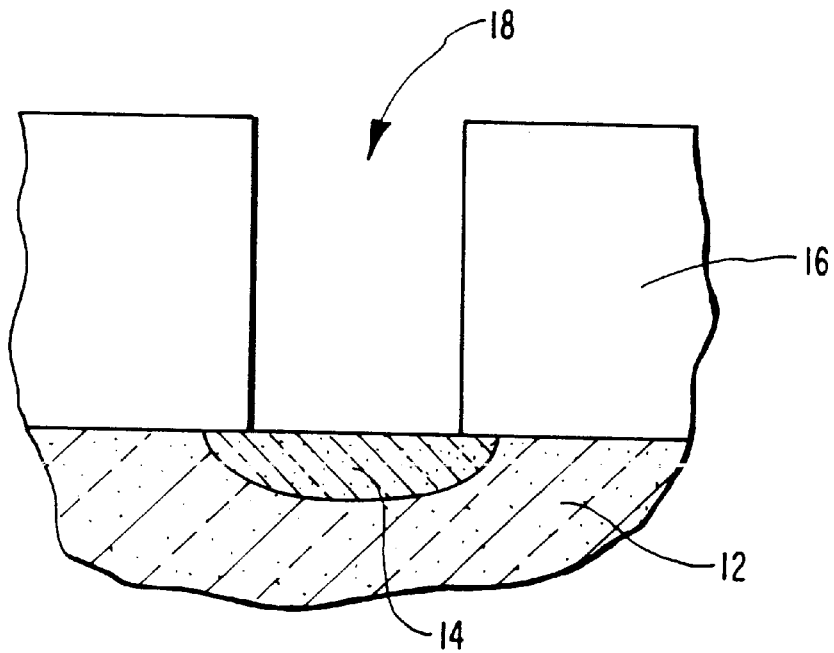
FIG. 1 is a cross-sectional elevation view showing the first step of the method of the present invention comprising forming an interconnect structure opening on the surface of a substrate of a silicon wafer.

Once active region 14 is formed, an etch barrier layer is deposited over active region 14 in order to select the depth of an etch process that will form a contact opening. This is followed by growing an insulative layer 16 over active region 14. Insulative layer 16 typically comprises silicon dioxide or borophosphorous silicate glass (BPSG). Insulative layer 16 is then masked and etched to form an interconnect structure opening 18. FIG. 1 shows completed interconnect structure opening 18.

When the interconnect structure being formed comprises a contact, a titanium or titanium nitride diffusion barrier can be deposited over interconnect structure opening 18 in order to prevent spiking. The titanium nitride diffusion barrier is preferably deposited using known techniques such as rapid thermal annealing of a titanium layer in an atmosphere of nitrogen.

Figure 2:
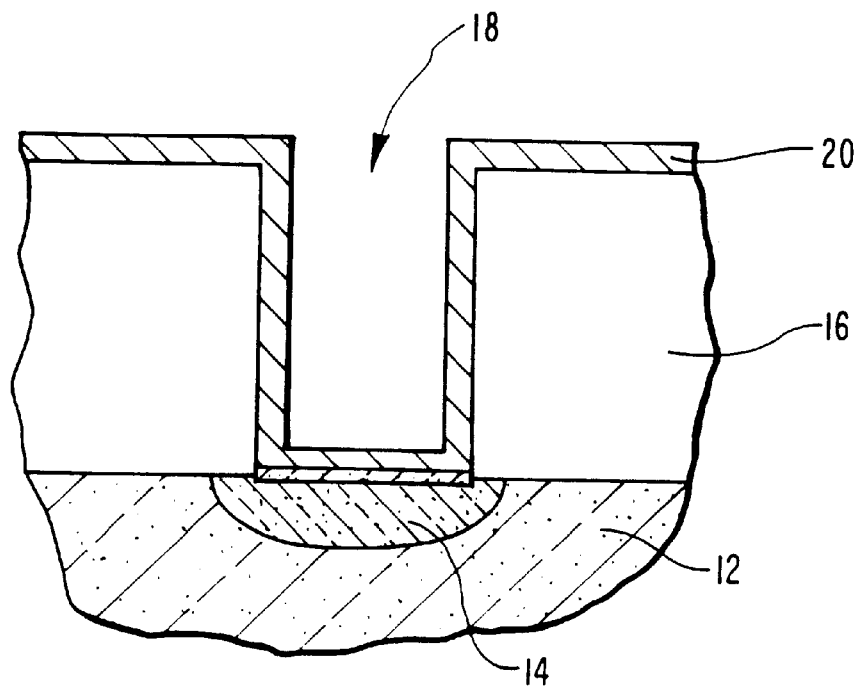
FIG. 2 is a cross-sectional elevation view illustrating a step subsequent to the interconnect structure opening formation of FIG. 1 of depositing a film of germanium over the surface of the interconnect structure opening.

In the next step of the inventive process, shown in FIG. 2, interconnect structure opening 18 is covered with a germanium layer 20. Germanium layer 20 is preferably deposited with a process of LPCVD, but any known process could be used. The LPCVD process is preferably conducted at a pressure of about 80 torr, a temperature of about 500° C. and for a duration of about 60 seconds. The source gas is preferably germane ($GeH_4$). Germanium layer 20 is preferably deposited in a thickness of about 50 to 200 Angstroms. In typical interconnect opening sizes, this will yield a 2 to 3% concentration of germanium in the final metallization alloy, which has been found to provide desirable results. The concentration of germanium in the alloy can be controlled by varying the thickness of the germanium layer. Consequently, it is a part of the present invention that the thickness of germanium layer 20 be varied in accordance with the desired aluminum-germanium concentration and the volume of interconnect structure opening 18.

When the interconnect structure being formed comprises a via, germanium layer 20 provides the advantage of reacting with a layer of native aluminum oxide that is known to form over interconnect structure opening 18 from exposure to the ambient. This reaction removes the native aluminum oxide layer from the bottom of interconnect structure opening 18.

Figure 3:
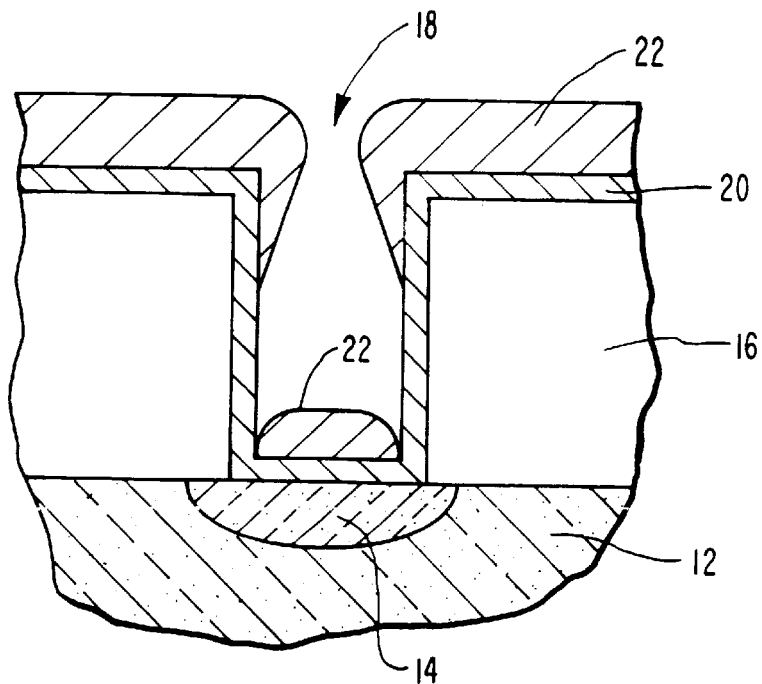
FIG. 3 is a cross-sectional elevation view illustrating a step subsequent to the germanium deposition of FIG. 2 of sputter depositing aluminum or an aluminum alloy into the interconnect structure opening.

In a further step of the method of the present invention, illustrated in FIG. 3, a metallization material 22, preferably comprising aluminum or aluminum alloy, is sputtered into interconnect structure opening 18 over germanium layer 20. Metallization material 22 can be deposited in one of two embodiments. In the first embodiment, metallization material 22 is reflow sputtered at a temperature of about 250–350° C. and with a pressure of about $1\times10^{-7}$ to $1\times10^{-2}$ torr. In the second embodiment, metallization material 22 is cold sputtered at a temperature of about 200° C. and a pressure of preferably between about $1\times10^{-7}$ to about $1\times10^{-2}$ torr.

Figure 4:
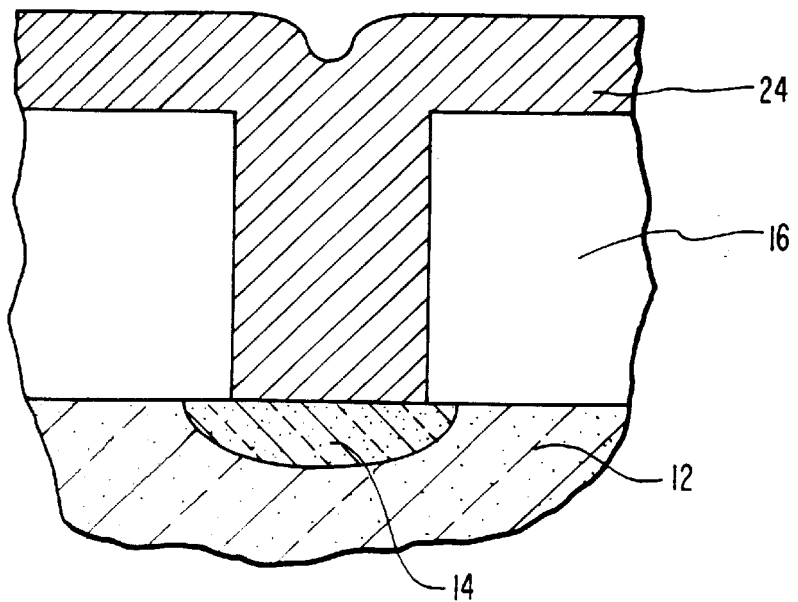
FIG. 4 is a cross-sectional elevation view of the interconnect structure opening of FIGS. 1 through 3 illustrating the results of reflow sputtering aluminum alloy into the interconnect structure opening and of an alternate embodiment of depositing aluminum alloy at a low temperature and then reflowing the aluminum alloy into the interconnect structure opening.

In the first embodiment where metallization material 22 is sputtered at 200–300° C., metallization material 22 undergoes immediate solid phase interdiffusion with germanium layer 20 due to the low eutectic temperature of aluminum and germanium and forms a germanium-aluminum alloy layer 24 as shown in FIG. 4. Due to the high diffusivity of germanium in aluminum during solid phase interdiffusion, which has been calculated by the inventors to be about 3 micrometers, metallization material 22 will be caused to migrate along germanium layer 20 down to the bottom of interconnect structure opening 18. This helps to fill interconnect structure opening 18 in a more uniform manner than if germanium layer 20 were not present. This in turn allows for the use of higher aspect ratios of interconnect structure openings while enabling desirable electrical conduction characteristics to be maintained.

In the second embodiment where metallization material 22 is deposited using cold sputtering, a second step is necessary of reflowing the metallization material 22 at a temperature of about 300–350° C. and with a pressure of between about $1\times10^{-7}$ to $1\times10^{-2}$ torr. The reflow step causes solid phase interdiffusion of the aluminum into the germanium, thereby forming germanium-aluminum alloy layer 24 which, as a result of solid phase diffusion, readily flows into and substantially fills interconnect structure opening 18 as shown in FIG. 4. Thus, metallization material 22 is caused to uniformly fill interconnect structure opening 18 resulting in high electrical conduction characteristics despite high aspect ratios, as in the first embodiment.

Metallization material 22 is preferably selected to contain a large concentration of aluminum in order to take advantage of the low eutectic alloying temperature of aluminum and germanium and of the corresponding high diffusivity of germanium in aluminum. Metallization material 22 is also preferably alloyed with copper to provide high electromigration resistance to the interconnect structure and thereby further enhance the reliability and electrical conduction of the interconnect structure.

An optional secondary reflow can be conducted after the deposition of metallization material 22 under either of the first or second embodiments. The secondary reflow of metallization material 22, when conducted at low temperatures, is beneficial in further reducing surface roughness. The secondary reflow can also be beneficially employed where an alloy other than the metallization material is desired to be incorporated into the surface of the interconnect structure. This may be necessary, for instance, where a more reliable surface material is required.

The method of the present invention works equally well for contacts, plugs, vias, or trenches. FIGS. 1 through 4 show the process as used in forming a contact. The process as used for forming a via is very similar. The difference is well known in the art and consists of the fact that the via, rather than contacting an active region 14 as the underlying portion of a semiconductor device, typically contacts a plug or other intermediate conducting structure which under the present invention comprises the underlying portion of a semiconductor device to be provided with electrical connection. In forming a plug, the process is essentially the same, though the plug opening may be differently shaped from depicted interconnect structure opening 18, as is generally understood in the art.

Figure 5:
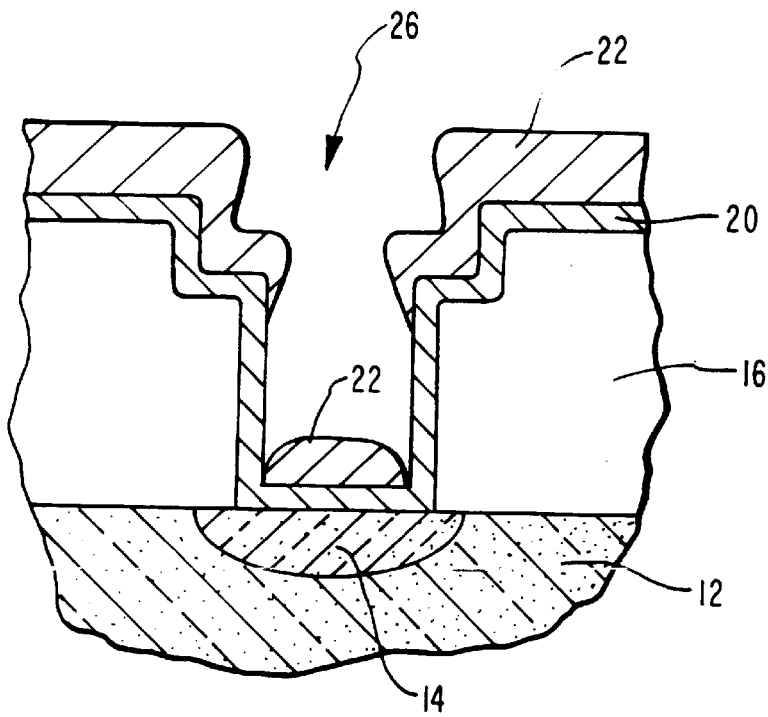
FIGS. 5 and 6 show the inventive method as used with a trench.
Figure 6:
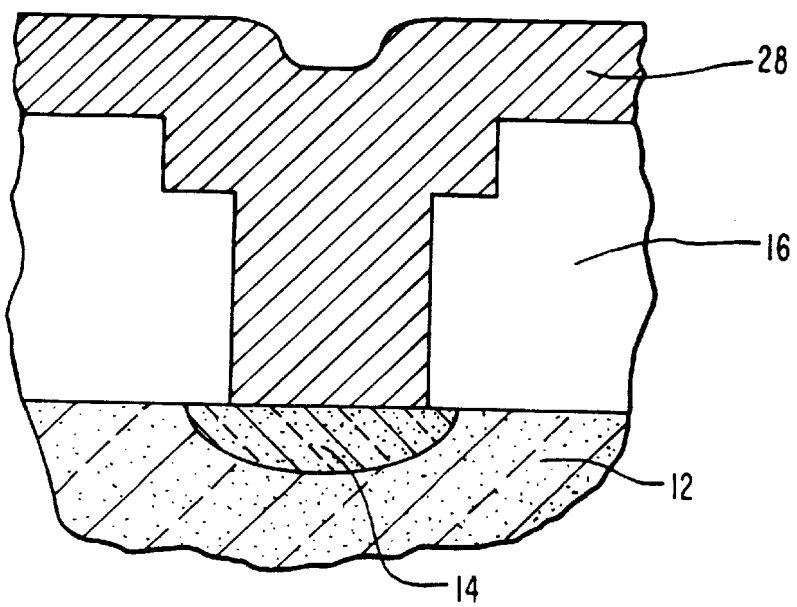

FIGS. 5 and 6 show the present method as employed in use for forming a trench. As shown therein, a trench opening 26 is first provided over an active region 14. Thereafter, a germanium layer 20 is deposited in trench opening 26, substantially as described above with reference to FIG. 4. Metallization material 24 is then deposited over germanium layer 20 in accordance with one of the two embodiments described above. The result of either of the two described embodiments is the trench 28 of FIG. 6.

Thus, the method of the present invention provides a contact, trench, plug, or via interconnect structure that can be formed with a high aspect ratio and still maintain desirable electrical characteristics. The resulting germanium-aluminum alloy of the interconnect structure is formed without expensive sputtering targets. The germanium aluminum alloy is also formed at a low temperature which reduces surface roughness. Standard aluminum alloys can be used for preventing electromigration resistance, and the alloy concentrations can be easily and inexpensively modified.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A contact structure comprising:
   a silicon layer;
   an insulating layer over the silicon layer;
   a contact opening having an aspect ratio greater than about 3 and extending through the insulating layer to the silicon layer;
   a metal-germanium alloy filling the contact opening and in contact with the silicon substrate, wherein there is a greater distribution of the metal in the metal-germanium alloy at the bottom of the contact opening than the germanium of the metal-germanium alloy.

2. The contact structure as defined in claim 1, wherein the metal-germanium alloy includes aluminum.

3. The contact structure as defined in claim 1, wherein the inhomogeneous metal-germanium alloy is formed within the contact opening by a reaction between aluminum and germanium.

4. The contact structure as defined in claim 1, wherein the metal-germanium alloy includes aluminum and one or more materials selected from the group consisting of copper and silicon.

5. The contact structure as defined in claim 1, wherein the metal-germanium alloy has a concentration of germanium in a range from 2% to 3%.

6. The contact structure as defined in claim 1, wherein the contact opening has a non-uniform width.

7. A contact structure comprising:
a silicon layer;
an insulating layer over the silicon layer;
a contact opening having an aspect ratio greater than about 3 and extending through the insulating layer to the silicon layer;
an aluminum-germanium alloy filling the contact opening and in contact with the underlying portion of the silicon substrate, wherein the contact opening has a bottom at which there is more aluminum than germanium.

8. The contact structure as defined in claim 7, wherein the aluminum-germanium alloy has a concentration of germanium in a range from 2% to 3%.

9. The contact structure as defined in claim 7, wherein the aluminum-germanium alloy includes copper.

10. A contact structure comprising;
a silicon layer;
an active region in the silicon layer;
an insulating layer over the silicon layer;
a contact opening having an aspect ratio greater than about 3 and extending through the insulating layer to the active region;
an aluminum-germanium alloy filling the contact opening and in contact with the active region, wherein the contact opening has a bottom on the active region at which there is a greater distribution of aluminum than germanium.

11. The contact structure as defined in claim 10, wherein the aluminum-germanium alloy has a concentration of germanium in a range from 2% to 3%.

12. The contact structure as defined in claim 10, wherein the aluminum-germanium alloy includes copper.

13. The contact structure as defined in claim 10, wherein the contact opening has a non-uniform width.

14. A contact structure comprising:
a silicon layer having an active region therein;
an insulating layer over the silicon layer;
a contact opening having an aspect ratio greater than about 3 and extending through the insulating layer to the active region;
an aluminum-germanium alloy filling the contact opening and in contact with the active region, wherein the metal-germanium alloy has a concentration of germanium in a range from 2% to 3% and includes one or more materials selected from the group consisting of copper and silicon, wherein contact opening has a bottom on the active region at which there is a greater distribution of aluminum than the germanium.

15. A contact structure comprising:
a silicon substrate;
an electrically conductive structure having a bottom, a height, and a width and being composed of a metal-germanium alloy in contact with and projecting from the silicon substrate, wherein the height is greater than about 3 times of the width, wherein the bottom of the electrically conductive structure has more of the metal of the metal-germanium alloy than the germanium of the metal-germanium alloy;
a dielectric layer situated Upon the silicon substrate and surrounding the electrically conductive structure from the silicon substrate to a top surface of the dielectric layer.

16. The contact structure as defined in claim 15, wherein the metal-germanium alloy includes aluminum.

17. The contact structure as defined in claim 16, wherein the metal-germanium alloy includes one or more materials selected from the group consisting of copper and silicon.

18. The contact structure as defined in claim 15, wherein the metal-germanium alloy has a concentration of germanium in range from 2% to 3%.

19. The contact structure as defined in claim 15, wherein the electrically conducive structure has a non-uniform width.

20. A contact structure comprising:
a silicon substrate having an electrically active region therein;
an electrically conductive structure having:
a height;
a width, said width being less than about one third of the height;
a shape that projects from the silicon substrate;
non-uniform width;
a composition of an aluminum-germanium alloy including one or more materials selected from the group consisting of copper and silicon; and
a base situated upon and making contact with the active region in the silicon substrate, and wherein the base of the electrically conductive structure has a greater distribution aluminum than germanium;
a dielectric layer having a top surface and being situated upon the silicon substrate and in contact with the electrically conductive structure from the silicon substrate to the top surface.

21. The contact structure as defined in claim 20, wherein the aluminum-germanium alloy has a concentration of germanium in a range from 2% to 3%.

22. The contact structure as defined in claim 20, wherein the second portion of the electrically conductive structure has a non-uniform width.

23. A contact structure comprising:
a silicon substrate;
an electrically conductive structure situated in a recess and being composed of a metal-germanium alloy in contact with and projecting from the silicon substrate, the recess having a base, a height, and a width, wherein the height of the recess is greater than about 3 times of the width of the recess, and where the base of the electrically conductive structure has a greater distribution of the metal of the metal-germanium alloy than the germanium of the metal-germanium alloy; and
a dielectric layer having a top surface and being situated upon the silicon substrate, the dielectric layer surrounding the electrically conductive structure and defining the recess, said electrically conductive structure filling the recess.

24. A contact structure comprising:
a silicon substrate having an electrically active region therein;
an electrically conductive structure that projects from the silicon substrate, is situated within and fills a recess having a height and a width that is less than about a third of the height of the recess, and has:
a non-uniform width;
a composition of an aluminum-germanium alloy including one or more materials selected from the group consisting of copper and silicon; and
a first portion that is situated upon and makes contact with the active region in the silicon substrate, wherein the first portion has more aluminum than germanium;

a dielectric layer that is situated upon the silicon substrate, that defines the recess, and that surrounds a second portion of the electrically conductive structure.

25. A contact structure comprising:

a semiconductor substrate;

an insulating layer over the semiconductor substrate, said insulating layer having a top surface;

a metal-germanium alloy having a base, a height, and a width that is less than about a third of said height, and extending from the base at a contact on the semiconductor substrate through the top surface of the insulating layer, wherein the base has more of the metal of the metal-germanium alloy than the germanium of the metal-germanium alloy.

26. The contact structure as defined in claim 20, wherein:

the second portion is upon the first portion; and the first and second portions have a width and the width of the first portion is less than that of the second portion.

27. The contact structure as defined in claim 26, wherein:

the second portion is a trench; and the first portion is a contact plug and comprises a diffusion barrier including titanium that is upon and makes contact with both the germanium-aluminum alloy and the active region in the silicon substrate.

* * * * *

UNITED STATES PATENT AND TRADEMARK OFFICE
CERTIFICATE OF CORRECTION

PATENT NO. : 6,093,968
DATED : July 25, 2000
INVENTOR(S) : Jeffrey Honeycutt; Sujit Sharan It is certified that error appears in the above-identified patent and that said Letters Patent is hereby corrected as shown below:

<u>Column 2,</u>
Line 67, before "into" change "diff-use" to -- diffuse --

<u>Column 4,</u>
Line 59, after "about" change "$x10^{-7}$" to -- $1x10^{-7}$ --

<u>Column 9,</u>
Line 64, after "situated" change "Upon" to -- upon --

Signed and Sealed this

Thirtieth Day of October, 2001

*Attest:*

NICHOLAS P. GODICI
*Attesting Officer*    *Acting Director of the United States Patent and Trademark Office*